(12) United States Patent
Kimura

(10) Patent No.: US 6,600,221 B2
(45) Date of Patent: Jul. 29, 2003

(54) SEMICONDUCTOR DEVICE WITH STACKED SEMICONDUCTOR CHIPS

(75) Inventor: Naoto Kimura, Kumamoto (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 09/942,313

(22) Filed: Aug. 29, 2001

(65) Prior Publication Data

US 2002/0053727 A1 May 9, 2002

(30) Foreign Application Priority Data

Aug. 31, 2000 (JP) .................................. 2000-263015

(51) Int. Cl.[7] ............................................. H01L 23/02
(52) U.S. Cl. .................. 257/686; 257/678; 257/685; 257/690; 257/692; 257/734; 257/773; 257/774; 257/777; 257/784; 257/737; 257/738
(58) Field of Search ................... 257/678, 684, 257/685, 686, 690, 692, 734, 737, 738, 773, 774, 777, 780, 784

(56) References Cited

U.S. PATENT DOCUMENTS 6,294,839 B1 * 9/2001 Mess et al. .................. 257/686
6,333,211 B1 * 12/2001 Sato et al. .................. 257/676
6,337,226 B1 * 1/2002 Symons ....................... 257/777

FOREIGN PATENT DOCUMENTS

| JP | 09139441 | 5/1997 |
| JP | 10-084076 | 3/1998 |
| JP | 10144851 | 5/1998 |
| JP | 11111758 | 4/1999 |

* cited by examiner

Primary Examiner—Nathan J. Flynn
Assistant Examiner—Pershelle Greene
(74) Attorney, Agent, or Firm—Katten Muchin Zavis Rosenman

(57) ABSTRACT

The present invention provides a semiconductor device having a substrate on which a plurality of semiconductor chips are stacked, wherein the semiconductor device comprising; a first semiconductor chip mounted on the substrate, a plurality of second semiconductor chips size of which are larger than that of the first semiconductor chip and stacked on the first semiconductor chip with a size-increasing order, a bonding pad formed on the semiconductor chip, a circuit pattern formed on the substrate, a bonding wire for connecting the bonding pad formed on the semiconductor chip and the circuit pattern formed on the substrate, a through hole, formed on the substrate, through which the bonding wire is to be inserted, and further wherein the bonding wire is wired so as to be substantially perpendicularly to a surface of the semiconductor chip.

2 Claims, 3 Drawing Sheets

SEMICONDUCTOR DEVICE WITH STACKED SEMICONDUCTOR CHIPS

BACKGROUND OF THE INVENTION

1. Field of the Invention

The present invention relates to a semiconductor device, and more particularly, to a semiconductor device comprising a plurality of stacked semiconductor chips.

2. Description of the Related Art

FIG. 2 shows a semiconductor device disclosed in the unexamined Japanese Patent Publication (KOKAI) No. 10-84076.

As shown in FIG. 2, the semiconductor device comprises a small chip 10, a large chip 20, a wiring board 30 having an inner terminal 33 and an outer terminal 36 connected to the inner terminal 33 via an electric wire 38, and an auxiliary frame 40 having a chip-side terminal 43 and a board-side terminal 46 connected to the chip-side terminal 43 using a connecting member 47. The small chip 10 is disposed on a central portion of the wiring board 30. An electrode pad 13 of the small chip 10 is connected to the inner terminal 33 of the wiring board 30 via a solder ball 14. The auxiliary frame 40 is engaged to the outer part of the small chip 10. An electrode pad 46 of the auxiliary frame 40 is connected to the inner terminal 33 of the wiring board 30 via a solder ball 48. The large chip 20 is superposed on the small chip 10 and the auxiliary frame 40, and an electrode pad 23 of the large chip 20 is connected to the chip-side terminal 43 of the auxiliary frame 40 via a solder ball 24.

According to this semiconductor device, however, the board 30 and the large chip 20 are connected to each other using the auxiliary frame 40, and since it is difficult to fabricate the auxiliary frame 40, the auxiliary frame 40 is expensive. Further, in this semiconductor device, since the connecting force between the chip and the board is great, it is difficult to release a thermal stress between the board and the chip generated based on a difference in coefficient of thermal expansion between the board and the chip, and there is a defect that a reliability of a temperature cycle is low.

In the case of a lamination type semiconductor device in which semiconductor chips 71, 72 and 73 are sequentially stacked on aboard 70 shown in FIG. 3, it is necessary to provide the board 70 with through holes 74. Therefore, there is a defect that the manufacturing cost of the board 70 becomes high.

SUMMARY OF THE INVENTION

Thereupon, it is an object of the present invention to provide a new, reliable and inexpensively produced semiconductor device in which the above-described defects of the prior art are overcome, a difference in coefficient of thermal expansion between a board and chip is absorbed.

To achieve the above object, the present invention basically employs the following technique.

That is, the present invention provides a semiconductor device having a substrate on which a plurality of semiconductor chips are stacked, wherein the semiconductor device comprising; a first semiconductor chip mounted on the substrate, a plurality of second semiconductor chips size of which are larger than that of the first semiconductor chip and stacked on the first semiconductor chip with a size-increasing order, a bonding pad formed on the semiconductor chip, a circuit pattern formed on the substrate, a bonding wire for connecting the bonding pad formed on the semiconductor chip and the circuit pattern formed on the substrate, a through hole, formed on the substrate, through which the bonding wire is to be inserted, and further wherein the bonding wire is wired so as to be substantially perpendicularly to a surface of the semiconductor chip.

With this structure, since a thermal stress generated based on a difference in coefficient of thermal expansion between the board and the chip is small, a reliability of the semiconductor chip is enhanced, and the semiconductor chip can be fabricated inexpensively.

DESCRIPTION OF THE PREFERRED EMBODIMENT

An embodiment of a semiconductor device of the present invention will be explained in detail with reference to the drawings below.

Figure 1:
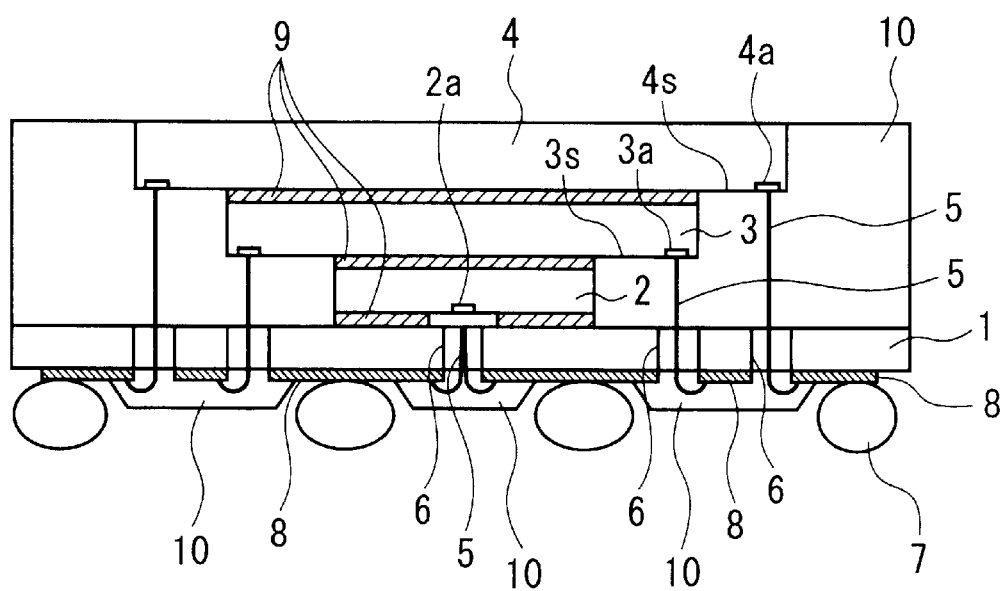
FIG. 1 is a sectional view of a semiconductor device according to the present invention.
Figure 2A:
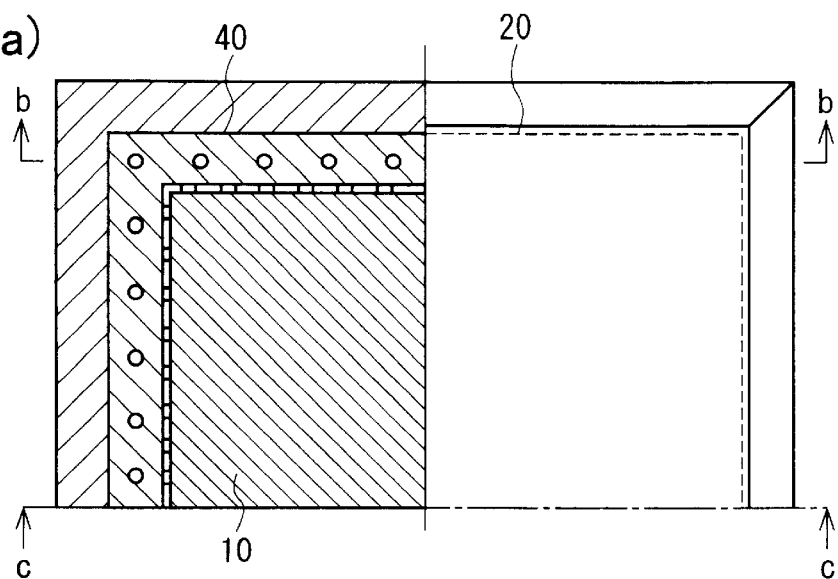
FIG. 2(a) is a plan view of a conventional semiconductor device.
Figure 2B:
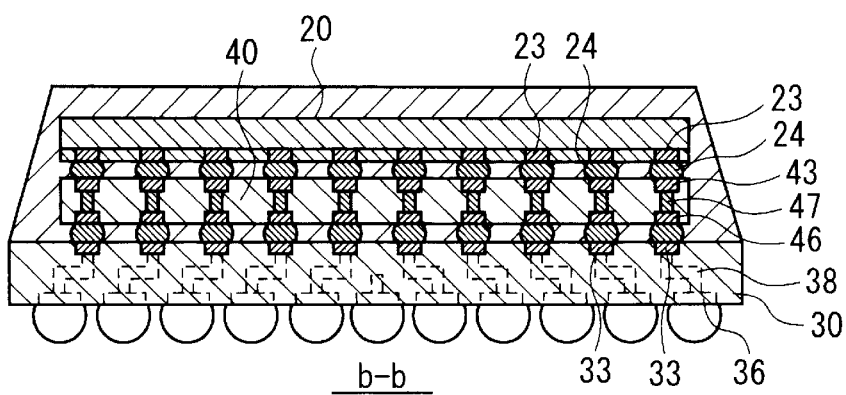
FIG. 2(b) is a cross sectional view cutting along b—b line shown in FIG. 2(a)
Figure 2C:
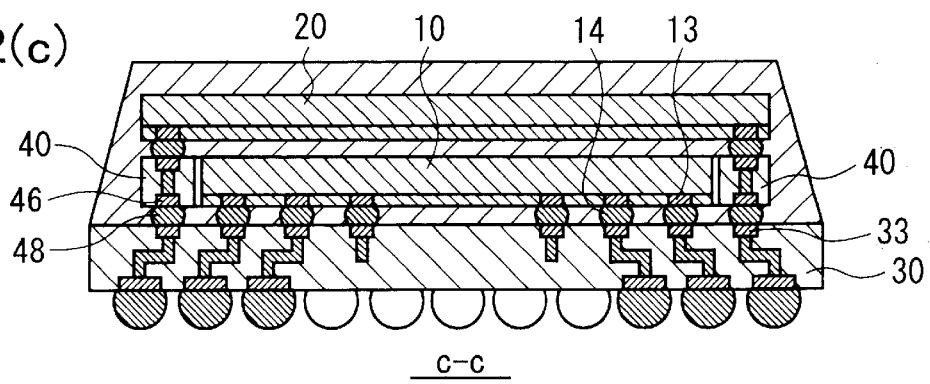
FIG. 2(c) is a cross sectional view cutting along c—c line shown in FIG. 2(a)
Figure 3:
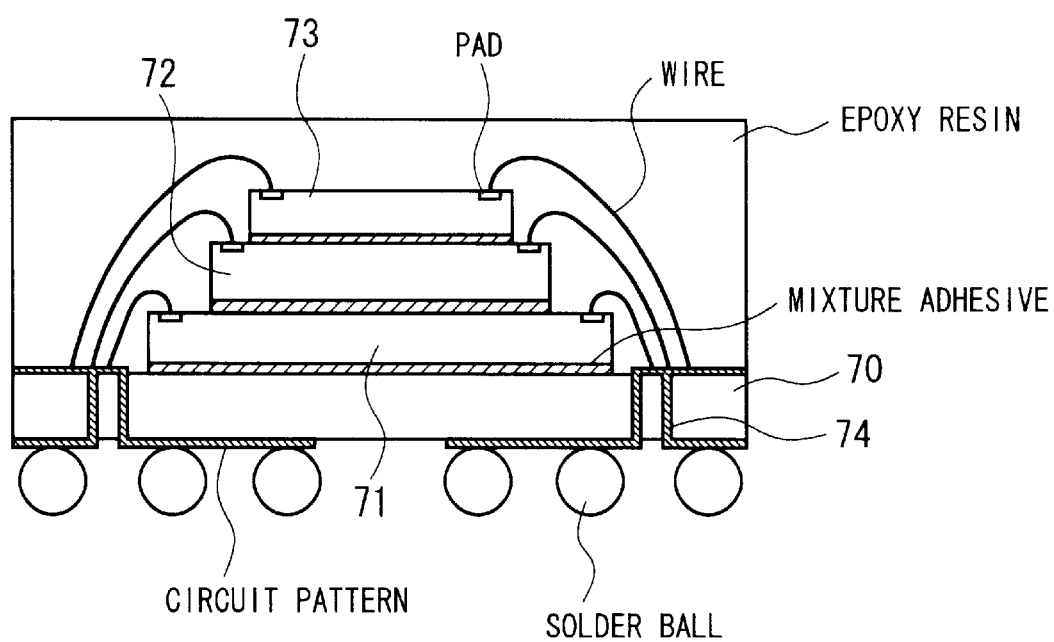
FIG. 3 is a sectional view of another conventional semiconductor device.

FIG. 1 is a sectional view showing the embodiment of the semiconductor device of the present invention. In FIG. 1, the semiconductor device comprises a board 1 on which a plurality of semiconductor chips 2, 3 and 4 are stacked. On the board 1, the smallest semiconductor chip 2 is assembled, on the semiconductor chip 2, the other larger semiconductor chips 3 and 4 are sequentially stacked. On a portion of the board 1 directly above bonding pads 2a, 3a and 4a of the stacked semiconductor chips 2, 3 and 4, a through hole 6 through which a bonding wire 5 is to be inserted, is provided. The bonding wire 5 is inserted into the through hole 6, and wired such that the bonding wire 5 is directed substantially perpendicularly to surfaces 3s, 4s of the semiconductor chips 3, 4.

The embodiment of the semiconductor device of the present invention will be explained in detail.

On a surface of the glass epoxy board (or tape board or ceramic board) 1 on which solder balls 7 are mounted and bonded, circuit pattern 8 made of conductive metal such as copper is provided. Additionally, the glass epoxy board 1 is provided with through holes 6 for inserting bonding wire 5 so as to connect to the circuit pattern 8 on the glass epoxy board 1.

In FIG. 1, three semiconductor chips are superposed, the number of chips may be two, or three or more. Each chip has different size, and the chips are bonded onto the board 1 in the size-increasing order using a mixture adhesive 9 comprising insulating epoxy resin and acrylic rubber. In generally, the chips are bonded such that centers of the chips coincide with a center of the board, but chips may be deviated. The chip is bonded such that a surface of the chip on which a circuit is formed is directed toward the board 1. The wires 5 are allowed to pass through the through holes 6 of the board 1, thereby the pads 2a, 3a and 4a of the chips 2, 3 and 4 and circuit pattern 8, 8, 8 are connected by the wires 5, 5, 5, respectively. The wire bonding is carried out from each pad to the circuit pattern on the board 1 in the shortest distance, but if it is difficult to carry out the wire bonding in the shortest distance due to the pads or layout of wiring, the wires may be bonded a little longer.

In FIG. 1, the pad 2a of the smallest chip 2 is located near the center of the chip 2. The second and third chips 3 and 4 are formed at their peripheries with pads 3a and 4a, respectively. The position of the pad 2a on the semiconductor chip 2 may be near the center or periphery, but in the case of the second and the third chips, their pads must be located at their peripheries.

The entire chips and the through holes 6 of the board 1 are sealed with epoxy resin 10 using a mold.

A back surface of the outermost largest chip 4 is not sealed with resin and is exposed so as to enhance the heat radiation effect. The solder balls 7 are mounted to the board 1, thereby the semiconductor device of the present invention is completed.

The semiconductor device of the present invention has the above-described structure, the following effects can be obtained.

(1) Since the board is a single-sided printed board, the number of fabricating steps for manufacturing the board is small, the manufacturing cost is low.

(2) Since the wires are short, the cost of the wire is low.

(3) Since the chips are bonded to the board in the size-increasing order, a difference in coefficient of thermal expansion between a board and chip can be moderated, and reliability to a temperature is enhanced.

What is claimed is:

1. A semiconductor device having a substrate on which a plurality of semiconductor chips are stacked on each other, wherein said semiconductor device comprises:

a first semiconductor chip mounted on an upper surface of said substrate, a plurality of second semiconductor chips size of which are larger than that of said first semiconductor chip and stacked on said first semiconductor chip with a size-increasing order, a bonding pad formed on a lower surface of one of said plurality of second semiconductor chips, a circuit pattern formed on a lower surface of said substrate, a bonding wire for connecting said bonding pad formed on said semiconductor chip and said circuit pattern formed on said substrate, a through hole, formed on said substrate, through which said bonding wire is to be inserted, and further wherein said bonding wire is wired so as to be substantially perpendicular to the lower surface of said one of said plurality of second semiconductor chips.

2. A semiconductor device having a substrate on which a plurality of semiconductor chips are stacked, wherein said semiconductor device comprises:

a first semiconductor chip mounted on an upper surface of said substrate, a second semiconductor chip size of which are larger than that of said first semiconductor chip and stacked on said first semiconductor chip, a bonding pad formed on a lower surface of said second semiconductor chip, a circuit pattern formed on a lower surface of said substrate, a bonding wire for connecting said bonding pad formed on said semiconductor chip and said circuit pattern formed on said substrate, a through hole, formed on said substrate, through which said bonding wire is to be inserted, and further wherein said bonding wire is wired so as to be substantially perpendicular to the lower surface of said second semiconductor chip.

* * * * *